US011557578B2

United States Patent
Sim et al.

(10) Patent No.: US 11,557,578 B2
(45) Date of Patent: Jan. 17, 2023

(54) BACKLIGHT UNIT AND DISPLAY DEVICE COMPRISING SAME

(71) Applicant: LG ELECTRONICS INC., Seoul (KR)

(72) Inventors: Sujin Sim, Seoul (KR); Minho Kim, Seoul (KR); Uihyung Lee, Seoul (KR); Yongmin Jung, Seoul (KR); Juyoung Joung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 38 days.

(21) Appl. No.: 17/044,307

(22) PCT Filed: Jan. 31, 2019

(86) PCT No.: PCT/KR2019/001337
§ 371 (c)(1),
(2) Date: Sep. 30, 2020

(87) PCT Pub. No.: WO2020/158976
PCT Pub. Date: Aug. 6, 2020

(65) Prior Publication Data
US 2021/0074693 A1    Mar. 11, 2021

(51) Int. Cl.
*H01L 25/13*        (2006.01)
*F21V 7/00*         (2006.01)
(Continued)

(52) U.S. Cl.
CPC ............ *H01L 25/13* (2013.01); *F21V 7/0083* (2013.01); *H01L 33/58* (2013.01); *F21Y 2115/10* (2016.08); *H01L 33/505* (2013.01)

(58) Field of Classification Search
CPC ....... H01L 25/13; H01L 33/58; H01L 33/505; G02F 1/133607; G02F 1/133614;
(Continued)

(56) References Cited

U.S. PATENT DOCUMENTS 9,678,382 B2    6/2017 Park et al.
9,823,507 B2 *  11/2017 Chae ................. G02F 1/133603
(Continued)

FOREIGN PATENT DOCUMENTS

CN    103148449    6/2013
CN    104696780    6/2015
(Continued)

OTHER PUBLICATIONS

PCT International Application No. PCT/KR2019/001337, International Search Report dated Oct. 28, 2019, 3 pages.
(Continued)

*Primary Examiner* — Kevin Quarterman
(74) *Attorney, Agent, or Firm* — Lee, Hong, Degerman, Kang & Waimey PC

(57) ABSTRACT

The present embodiment comprises: a plurality of light-emitting units; and a reflector including reflector units having spaces formed to receive the plurality of light-emitting units, respectively. Each of the plurality of light-emitting units includes an LED package mounted on a substrate and a light diffusion layer having a groove portion formed on a surface opposite to the substrate in the LED package, wherein the outer circumference of the light diffusion layer faces the inner surface of a reflector unit. In the reflector, the plurality of reflector units are integrally formed, the spaces expand along a direction extending away from the substrate, and a wall forming each of the spaces surrounds the outer circumference of each of the LED package and the light diffusion layer.

8 Claims, 5 Drawing Sheets

(51) Int. Cl.
  *H01L 33/58* (2010.01)
  *F21Y 115/10* (2016.01)
  *H01L 33/50* (2010.01)

(58) Field of Classification Search
  CPC ......... G02F 1/133605; G02F 1/133606; G02F
    1/133603; G02B 6/0051; G02B 6/0073;
    F21V 7/0083; F21Y 2115/10
  See application file for complete search history.

(56) References Cited

U.S. PATENT DOCUMENTS

| | | | |
|---|---|---|---|
| 9,971,197 | B2* | 5/2018 | Song .................. F21V 7/04 |
| 2004/0218390 | A1 | 11/2004 | Holman et al. |
| 2013/0013252 | A1* | 1/2013 | Ono .................. G01B 11/24 |
| | | | 702/167 |
| 2015/0159834 | A1 | 6/2015 | Chang |
| 2022/0037567 | A1* | 2/2022 | Kameshima ........... H01L 33/54 |

FOREIGN PATENT DOCUMENTS

| | | |
|---|---|---|
| JP | 2004319340 | 11/2004 |
| JP | 2006520518 | 9/2006 |
| JP | 2007149451 | 6/2007 |
| JP | 5474812 | 4/2014 |
| JP | 2014529874 | 11/2014 |

OTHER PUBLICATIONS

European Patent Office Application Serial No. 19913093.1, Search Report dated Dec. 17, 2021, 9 pages.

Korean Intellectual Property Office Application No. 10-2020-7026547, Office Action dated Apr. 15, 2022, 6 pages.

Korean Intellectual Property Office Application Serial No. 10-2020-7026547, Notice of Allowance dated Oct. 21, 2022, 3 pages.

* cited by examiner

BACKLIGHT UNIT AND DISPLAY DEVICE COMPRISING SAME

CROSS-REFERENCE TO RELATED APPLICATION

This application is the National Stage filing under 35 U.S.C. 371 of International Application No. PCT/KR2019/001337, filed on Jan. 31, 2019, the contents of which are all incorporated by reference herein in their entirety.

TECHNICAL FIELD

The present disclosure relates to a backlight unit and a display device having the same.

BACKGROUND ART

As the information society is developed, the demand for a display device is increasing in various forms. In match to the demand, various display devices, such as a liquid crystal display device (LCD), a plasma display panel (PDP), an electro luminescent display (ELD), an organic light emitting diode (OLED), and a vacuum fluorescent display (VFD), have been studied and used.

Some of the display devices may include a backlight unit to emit light to a display panel.

The backlight unit is classified into an edge type backlight unit and a direct type backlight unit depending on the position of a light source.

The edge type backlight unit excellently represents the uniformity of light, because light sources are disposed on left and right side surfaces or left and right side surfaces of the display panel and the light is uniformly dispersed on the front surface of the display panel using a light guide plate.

Meanwhile, the direct type backlight unit may be mainly used for a large scale display requiring higher brightness, because a plurality of light sources are disposed under the display panel and a light efficiency is more excellently represented as compared to that of the edge type backlight unit.

Korean Patent Registration No. 10-1832311 B1 (published on Feb. 26, 2018) discloses a display device having a backlight unit, and the display device includes a backlight unit including a reflector, a light source module, and a lens. The lens may be mounted between the light source module and the reflector to surround the light source module, after manufactured separately from each of the light source and the reflector.

DISCLOSURE

Technical Problem

According to the backlight unit of the related art, the process and the time to insert the lens into the reflector may be required, and image quality may be degraded when the light source module and the lens are misaligned from each other in optical axis.

According to the backlight unit of the related art, when the lens has a thicker thickness, the whole thickness of the backlight unit may be increased.

The present disclosure is to provide a backlight unit capable of simplifying the assembling process, reducing the manufacturing time, and minimizing image quality, and a display device having the same.

The present disclosure is to provide a backlight unit which can be realized in slim size, and a display device having the same.

Technical Solution

According to an embodiment of the present disclosure, a backlight unit may include a plurality of light emitting units, and a reflector having a reflector unit formed to have a space to receive each of the plurality of light emitting units.

Each light emitting unit may include an LED package mounted on a substrate, and a light diffusion layer formed on an opposite surface of the substrate in the LED package, formed with a groove in a top surface, and having an outer circumference which faces an inner surface of the reflector unit.

A plurality of reflector units may be integrally foamed in the reflector.

The space may be expanded as the space is away from the substrate.

A wall defining the space may surround an outer circumference of the LED package and an outer circumference of the light diffusion layer.

The LED package may include an LED chip light source, and a phosphor to surround a top surface and an outer circumference of the LED chip light source.

The light diffusion layer may be formed on a top surface of the phosphor.

The light diffusion layer may be a $TiO_2$ coating layer applied to the top surface of the phosphor.

A shape of a longitudinal-section of the groove may be a triangular shape, and may extend in a stripe shape from one end of the light diffusion layer to an opposite end of the light diffusion layer.

The groove may have a cross shape when viewed from above the light diffusion layer.

An inner surface of the wall may include an inclined surface inclined with respect to an optical axis direction of the light emitting unit.

Each of a boundary between the LED package and the light diffusion layer and a top surface of the light diffusion layer faces the inclined surface.

Each of a bottom surface of the LED package, a boundary between the LED package and the light diffusion layer, and a top surface of the light diffusion layer may be spaced apart from the wall.

A first distance between the bottom surface of the LED package and the wall may be shorter than a second distance between the boundary and the wall.

A third distance between the top surface of the light diffusion layer and the wall may be longer than the second distance.

According to an embodiment of the present disclosure, a display device having a backlight unit may include a display panel, an optical sheet which faces the display panel, the backlight unit to emit light toward the optical sheet. In addition, the top surface of the light diffusion layer constituting the backlight unit may face the optical sheet. The top surface of the light diffusion layer may be a flat surface, a groove may be formed in the top surface of the light diffusion layer, and the distance between the top surface of the light diffusion layer and the optical sheet may be uniform.

Advantageous Effects

According to an embodiment of the present disclosure, the light emitting unit includes the light diffusion layer integrally formed with the LED package to diffuse the light to the reflector, and the light diffused around the light diffusion layer is reflected from the reflector, thereby simplifying the assembly process and shortening the manufacturing time as compared to when a separate lens is installed instead of the light diffusion layer.

In addition, since the light diffusion layer is integrally formed with the LED package, compactness may be realized as compared to when the separate lens is mounted instead of the light diffusion layer, and the slim backlight unit may be realized.

BEST MODE

Mode for Invention

Hereinafter, the detailed embodiment of the present disclosure will be described in detail with reference to accompanying drawings.

Figure 1:
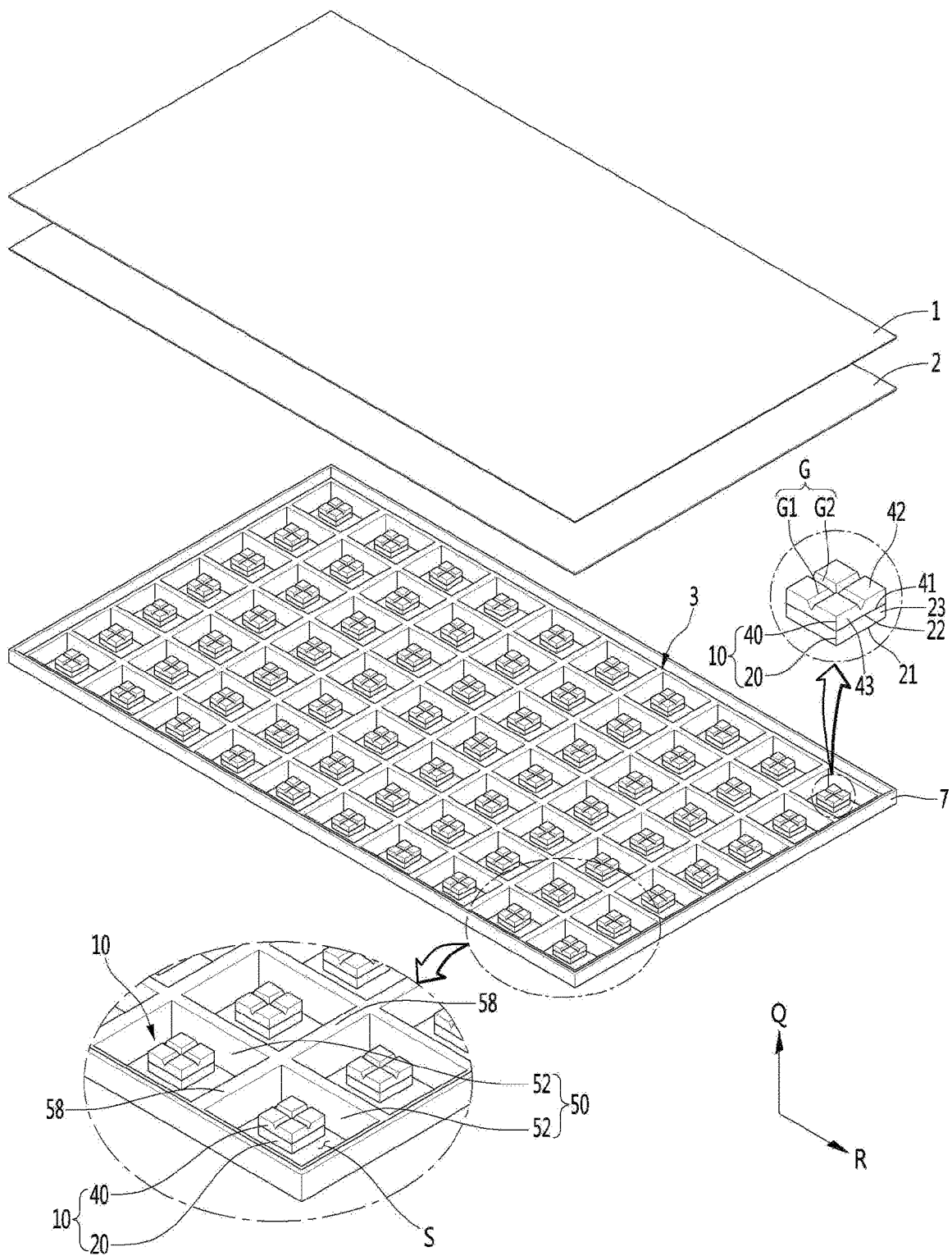
FIG. 1 is an exploded perspective view of a display device having a backlight unit according to an embodiment of the present disclosure.
Figure 2:
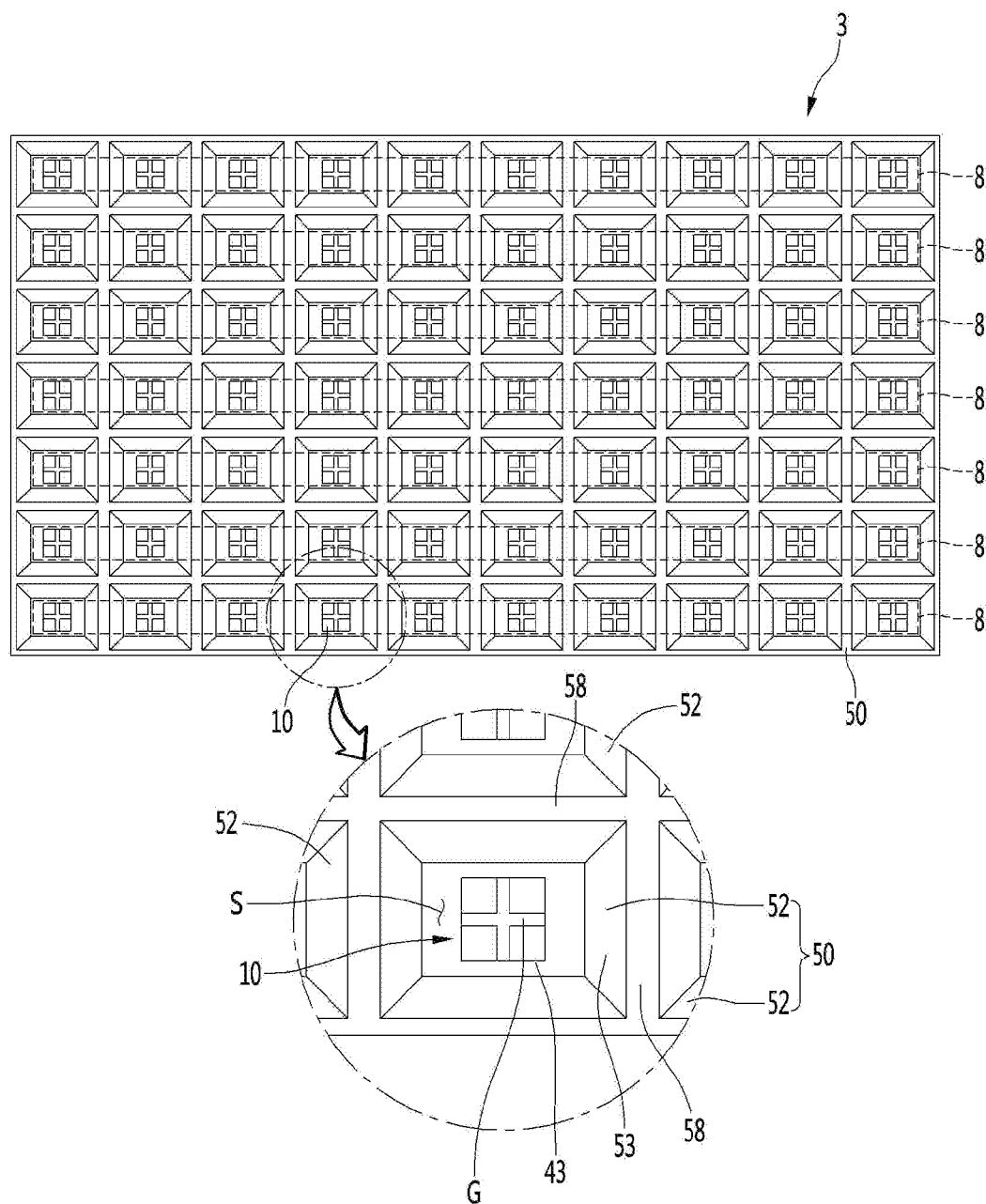
FIG. 2 is a front view of a backlight unit in an upright state according to an embodiment of the present disclosure.
Figure 3:
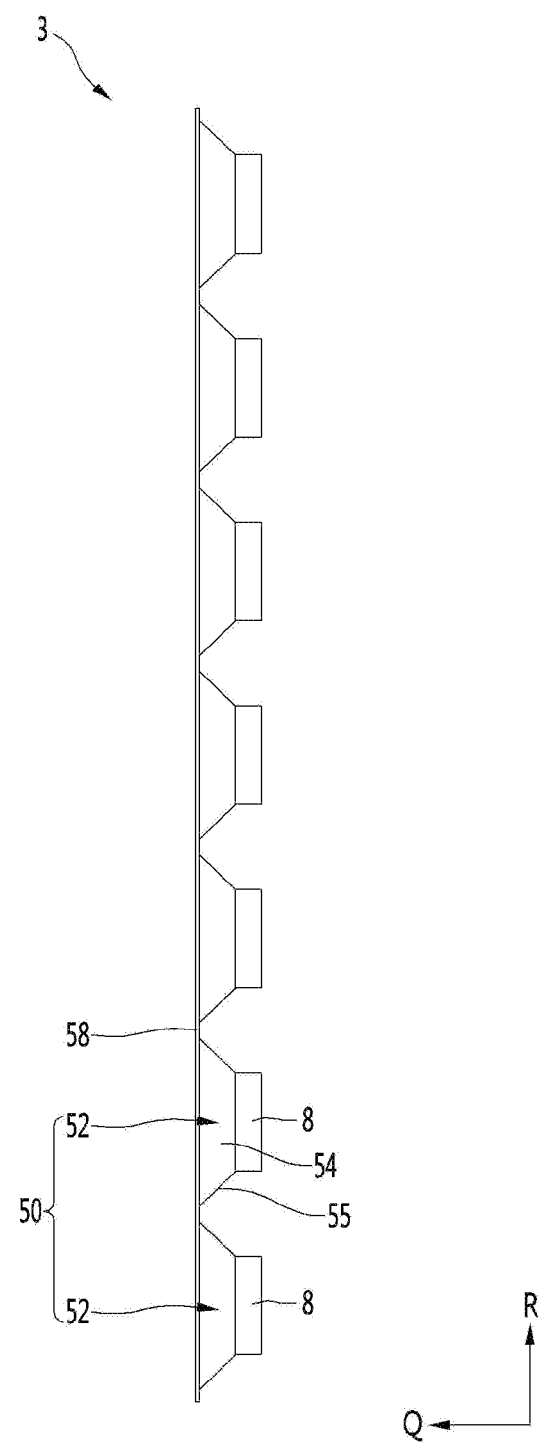
FIG. 3 is a side view of a reflector in an upright state according to an embodiment of the present disclosure.
Figure 4:
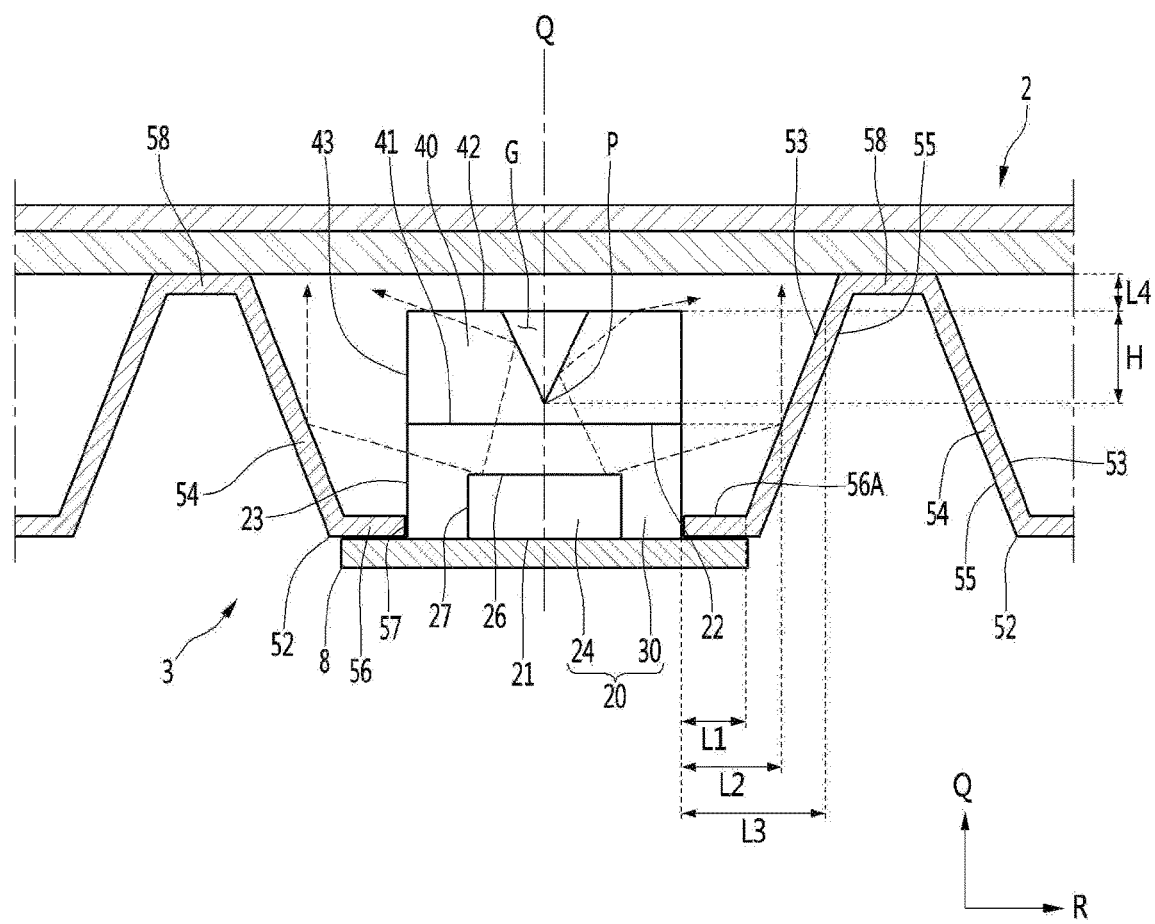
FIG. 4 is a cross-sectional view of a backlight unit laid down according to an embodiment of the present disclosure.

FIG. 1 is an exploded perspective view of a display device having a backlight unit according to an embodiment of the present disclosure. FIG. 2 is a front view of a backlight unit in an upright state according to an embodiment of the present disclosure. FIG. 3 is a side view of a reflector in an upright state according to an embodiment of the present disclosure. FIG. 4 is a cross-sectional view of a backlight unit laid down according to an embodiment of the present disclosure.

A display device may include a display panel 1 to display an image, an optical sheet 2 which faces the display panel 1, and a backlight unit 3 to emit light toward the optical sheet 2.

The display panel 1 may be an LCD panel or an LED panel, and may be provided in various types as long as displaying an image by light emitted from the backlight unit 3.

The optical sheet 2 may be formed the form of the combination of a plurality of sheets, and may include, for example, at least one diffusion sheet and at least one prism sheet.

The backlight unit 3 may include an LED package 20 (hereinafter, referred to as an LED package) serving as a light source. In addition, the backlight unit 3 may be a top view type backlight unit in which a direction (Q, hereinafter, referred to as an optical axis direction) of light emitted from the LED package 20 is directed toward the display panel 1.

According to the present specification, the optical axis direction "Q" may be in a vertical direction on the basis of when the display device is laid down, and the optical axis direction "Q" may be a front-rear direction on the basis of when the display device is in an upright state.

The backlight unit 3 may include at least one substrate 8, a plurality of light emitting units 10, and a reflector 50.

The backlight unit 3 may further include a case 7, and at least one substrate 7 may be mounted in the case 7. The substrate 7 may be a PCB.

The substrate 8 may be mounted in the case 7 to correspond to the light emitting unit 10 in a 1:1 correspondence, and may be mounted, in number smaller than the number of light emitting units 10, in the case 7. A plurality of light emitting units 10 may be mounted on the PCB 8. The backlight unit 3 may include a plurality of PCBs 8 on which a plurality of light emitting units 10 are mounted.

Each of the plurality of light emitting units 10 may be mounted on the substrate 8.

The reflector 50 may include a reflector unit 52 to receive the light emitting unit 10 therein. The reflector unit 52 may be formed to be larger than the light emitting unit 10, and the light emitting unit 10 may be received in a space "S" defined inside the reflector unit 52, and the reflector unit 52 may surround the outer circumference of the light emitting unit 10.

In this case, the outer circumference of the light emitting unit 10 may be defined with an outer circumference of the LED package 10 and an outer circumference of a light diffusion layer 40, which are to be described later.

The light emitting unit 10 and the reflector unit 52 may correspond to each other at the ratio of 1:1, and the backlight unit 3 may have one light emitting unit 10 received in one reflector unit 52.

The reflector 50 may include a plurality of reflector units 52 to receive a plurality of light emitting units 10.

The reflector 50 may include a plurality of reflector units 52 having spaces "S" for receiving a plurality of light emitting units 10, respectively.

The reflector 50 may have a rectangular shape in an outer edge thereof.

When the backlight unit 3 is laid down in the horizontal direction, the plurality of reflector units 52 may be consecutively formed in the front-rear direction and a left-right direction, and the plurality of light emitting units 10 may be spaced apart from each other in the front-rear direction and the left-right direction.

When the backlight unit 3 is in the upright state in the vertical direction, the plurality of reflector units 52 may be consecutively formed in the vertical direction and the left-right direction, and the plurality of light emitting units 10 may be spaced apart from each other in the vertical direction and the left-right direction.

Each of the plurality of light emitting units 10 may include an LED package 20 and the light diffusion layer 40 integrally formed with the LED package 20.

Referring to FIG. 4, a bottom surface 21 of the LED package 20 may be mounted on a top surface of the substrate 8, the top surface of the LED package 20 may be an opposite surface 22 to the bottom surface 21 of the LED package 20, and the top surface of the LED package 20 may be a surface which faces the light diffusion layer 40.

The LED package 20 may include an LED chip light source 24 and a phosphor 30.

For example, in the LED package 20, the LED chip light source 24 may include a blue LED chip, and the phosphor 30 may be a yellow phosphor covering the blue LED chip.

For another example, in the LED package 20, the LED chip light source 24 may include a blue LED chip, and the phosphor 30 may include all of a yellow phosphor, a red phosphor, and a green phosphor.

A bottom surface of the LED chip light source 24 may make contact with the top surface of the substrate 8. A top surface 26 and a circumferential surface 27 of the LED chip light source 24 may be covered by the phosphor 30, and the phosphor 30 may surround the top surface 26 and an outer circumference 27 of the LED chip light source 24.

The phosphor 30 may be in a polygonal shape, for example, in a hexahedron shape.

The bottom surface of the LED chip light source 24 and the bottom surface of the phosphor 30 may form the bottom surface 21 of the LED package 20.

The top surface of the phosphor 30 may be the top surface 22 of the LED package 20, and the outer circumference of the phosphor 30 may be the outer circumference 23 of the LED package 20.

The light diffusion layer 40, which widely diffuses light emitted from the LED package 20 to the surroundings, may be formed of a material and a shape capable of diffusing the light to the surroundings.

The light diffusion layer 40 may be formed on the opposite surface 22 of the substrate 8 of the LED package 20. The light diffusion layer 40 may cover the top surface 22 of the LED package 20. The light diffusion layer 40 may be formed on a top surface of the phosphor 30. The area of the bottom surface 41 of the light diffusion layer 40 may be equal to the area of the top surface of the LED package 20.

The bottom surface 41 of the light diffusion layer 40 may be integrated with the top surface 22 of the LED package 20, that is, the top surface of the phosphor 30, and the bottom surface 41 of the light diffusion layer 40 and the top surface 22 of the LED package 20 may be substantially the same surface, and this surface may be a boundary between the light diffusion layer 40 and the LED package 20.

The top surface 42 of the light diffusion layer 40 may face the optical sheet 2, and the outer circumference 43 of the light diffusion layer 40 may face the inner surface 53 of the reflector unit 52.

The light diffusion layer 40 may include a circumferential surface 43 connecting the bottom surface 41 to the top surface 42. The light diffusion layer 40 may be substantially in a hexahedron shape. In the case, the circumferential surface 43 of the light diffusion layer 40 may include four sides of a left side, a right side, a front side, and a rear side. The circumferential surface 43 of the light diffusion layer 40 may face the inner surface 53 of the reflector unit 52 in a direction perpendicular to the optical axis "Q".

The light diffusion layer 40 may include a $TiO_2$ coating layer applied to the top surface of the phosphor 30.

A groove "G" may be formed in the top surface 42 of the light diffusion layer 40. The shape of the longitudinal-section of the groove "G" may be triangular, and may extend in a stripe shape from one end of the light diffusion layer 40 to an opposite end of the light diffusion layer 40.

A part, which includes the groove "G", of the light diffusion layer 40 may include a pair of inclined surfaces which faces in a direction "R" perpendicular to the optical axis direction "Q", and bottom surfaces of the pair of inclined surfaces may be connected to each other while forming a V shape. The inclined surface may be formed to have an acute angle with respect to an extension line extending in the optical axis direction "Q" from a vertex to which the pair of inclined surfaces are connected.

In addition, each of the pair of inclined surfaces forming the groove "G" and the top surface 42 of the light diffusion layer 40 may be formed to have an obtuse angle.

The groove "G" may be cross-shaped when viewed from above the light diffusion layer 40 on the basis of when the backlight unit is laid down in the horizontal direction. The groove "G" may include a first groove "G1" having a long stripe shape extending in the vertical direction on the basis of when the backlight unit is in the upright state, and a second groove "G2" having a long stripe shape extending in the left-right direction. The first groove "G1" may cross the second groove "G2".

The top surface 42 of the light diffusion layer 40 may be a flat surface instead of a curved surface. The groove "G" formed in the top surface 42 of the light diffusion layer 40 is recessed in the flat surface. The groove "G" may be recessed at an equal depth "H" (see FIG. 4) in the top surface 42 of the light diffusion layer 34 while extending lengthwise of the groove "G".

The top surface 42 of the light diffusion layer 40 may be defined as a part without the groove "G" when viewed from above the light diffusion layer 40, and the distance "L4" (see FIG. 4) between the top surface 42 of the light diffusion layer 40 and the optical sheet 2 may be constant In this case, a distance "L4" between the top surface 42 of the light diffusion layer 40 and the optical sheet 2 may be the distance in the vertical direction (i.e., the optical axis direction Q), and the top surface 42 of the light diffusion layer 40 may be at the equal distance from the optical sheet 2 regardless of the position.

The plurality of reflector units 52 constituting the reflector 50 may be integrally formed. The reflector 50 may be a foaming reflector in which the plurality of reflector units 52 are integrally foamed.

Each of the plurality of reflector units 52 may include a wall 54 for defining the space "S".

The wall 54 for forming the space "S" may surround the outer circumference 23 of the LED package 20 and the outer circumference 43 of the light diffusion layer 40.

The space "S" may be formed to be more expanded, as the space "S" farther away from the substrate 8. The wall 54 may be in a three-dimensional shape.

The wall 54 may include a left wall, a right wall, a front wall, and a rear wall on the basis of when the backlight unit is laid down in the horizontal direction, and the space "S" surrounded by the left wall, the right wall, the front wall, and the rear wall may be defined as a space for receiving the light emitting unit 10.

The wall 54 may include a left wall, a right wall, a front wall, and a rear wall on the basis of when the backlight unit is in the upright state in the vertical direction, and the space "S" surrounded by the left wall, the right wall, the front wall, and the rear wall may be defined as a space for receiving the light emitting unit 10.

An inner surface 53 of the wall 54 may include an inclined surface inclined with respect to the optical axis direction "Q" of the light emitting unit 20. The inclined surface may be formed at an acute angle with respect to the optical axis direction "Q".

Meanwhile, an outer surface 55 of the wall 54 may be spaced from an outer surface 55 of a wall 54 of the adjacent another reflector unit 52. The inner surface 53 of the wall 54 may be an inclined surface substantially, and the inner surface 53 of the wall 54 and the inclined surface are assigned with the same reference numeral '53'.

The wall 54 may be inclined with respect to the optical axis direction "Q", like the inclined surface 53. Such a wall 54 may be formed at an acute angle with respect to the optical axis direction "Q".

Each of the plurality of reflector units 52 may further include a base 56 extending from the wall 54, and one surface 56A of the base 56 which faces the optical sheet 2. The base 56 may be formed in a direction "R" perpendicular to the optical axis direction "Q". The base 56 may be formed therein with a hole 57 to surround a portion of the outer circumference 23 of the LED package 20. That is, each of the plurality of reflector units 52 may include the wall 54 and the base 56.

Meanwhile, in the reflector 50, the wall 54 of each reflector unit 52 may be directly connected to the wall 54 of the adjacent reflector unit 52, and the wall 54 of each reflector unit 52 may be connected with the wall 54 of the adjacent another reflector unit 52 through an additional connecting body 5 In this case, the plurality of reflector units 52 may be spaced apart from each other through the connecting body 58.

The plurality of reflector units 52 and the connecting body 58 may be integrally foamed, and the connecting body 58 may be substantially formed in a lattice shape.

The boundary between the LED package 20 and the light diffusion layer 40 and each top surface 22 of the light diffusion layer 40 may face the inclined surface 53.

The boundary between the LED package 20 and the light diffusion layer 40 may be the top surface 22 of the LED package 20 and may be the bottom surface 41 of the light diffusion layer 40. Hereinafter, for the convenience of explanation, the boundary between the LED package 20 and the light diffusion layer 40 will be described with reference numeral '41', and will be named a "boundary 41" for the illustrative purpose.

The bottom surface 21 of the LED package 20, the boundary 41 between the LED package 20 and the light diffusion layer 40, and the top surface 42 of the light diffusion layer 40 may be spaced apart from the wall 44.

A first distance "L1" between the bottom surface 21 of the LED package 20 and the wall 44 is shorter than a second distance 'L2' between the boundary 41 and the wall 44, and the third distance 'L3' between the top surface 42 of the light diffusion layer 40 and the wall 44 may be longer than the second distance 'L2'.

Each of the first distance 'L1', the second distance 'L2', and the third distance 13' may be a distance in the direction 'R' perpendicular to the optical axis direction 'Q'.

Figure 5:
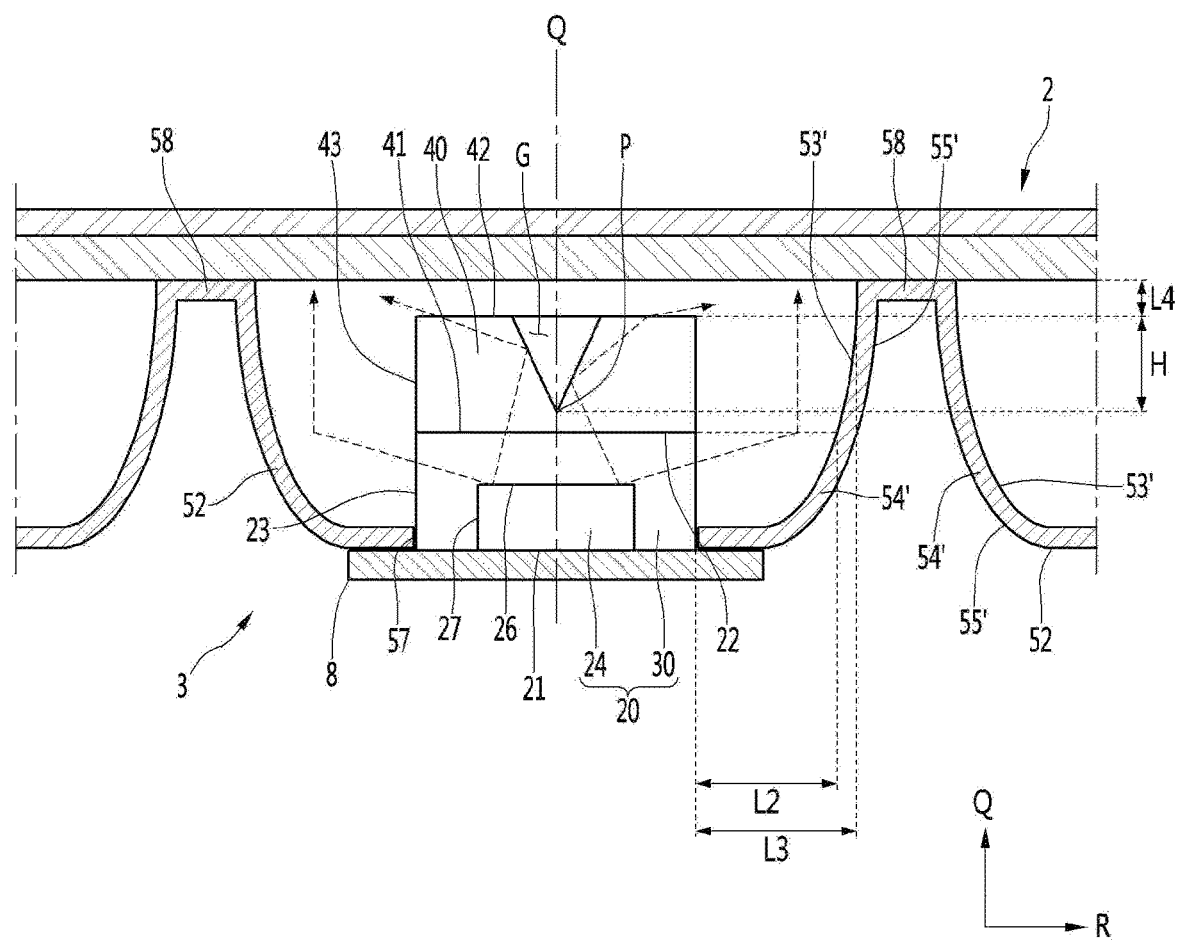
FIG. 5 is a front view of a backlight unit laid down according to another embodiment of the present disclosure.

FIG. 5 is a front view of a backlight unit laid down according to another embodiment of the present disclosure.

According to the present embodiment, the shape of a wall 53' of the reflector unit 52 may be different from the shape of a wall 53 of the reflector unit 52 as illustrated in FIG. 4. An inner surface 53' of the reflector unit 52 may be a curved surface, and a wall 54' of the reflector unit 52 may be formed to have the shape of being gently curved at a lower portion thereof and sharply curved toward an upper portion thereof. The outer surface 55' of the reflector unit 52 may be also be curved. For example, such a reflector unit 52 may be in a hemispherical shape.

The reflector unit 52 may be formed in the center thereof with a hole 57 to surround a portion of an outer circumferential surface of the LED package 20.

The substrate 8, the LED package 20, the light diffusion layer 40, and the optical sheet 2 are identical to or similar to those of the backlight unit illustrated in FIG. 4. Accordingly, the following description will be made with the same reference numerals to avoid redundancy.

Each of the outer circumference 23 of the LED package 20 and the outer circumference 43 of the light diffusion layer 40 may face the inner surface 53', which is formed in the curved shape, of the reflector unit 52 in a direction perpendicular to the optical axis direction "Q".

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

Therefore, the exemplary embodiments of the present disclosure are provided to explain the spirit and scope of the present disclosure, but not to limit them, so that the spirit and scope of the present disclosure is not limited by the embodiments.

The scope of the present disclosure should be construed on the basis of the accompanying claims, and all the technical ideas within the scope equivalent to the claims should be included in the scope of the present disclosure.

What is claimed is:

1. A backlight unit comprising:
   a plurality of light emitting units; and
   a reflector including a plurality of reflector units having spaces for receiving the plurality of light emitting units, respectively,
   wherein each light emitting unit includes:
   a light emitting diode (LED) package mounted on a substrate; and
   a light diffusion layer with a groove on an opposite surface of the substrate in the LED package and having an outer circumferential surface which faces an inner surface of a reflector unit,
   wherein the groove has a cross shape when viewed from above the light diffusion layer,
   wherein each of the plurality of reflector units includes a wall defining a space surrounding an outer circumference of each of the light emitting diode (LED) package and the light diffusion layer,
   wherein the space expands along a direction leading away from the substrate,
   wherein the light diffusion layer has a coating layer only on a top surface of the LED package,
   wherein a bottom surface of the light diffusion layer has a substantially same surface as the top surface of the LED package,
   wherein the outer circumferential surface of the LED package faces the wall.

2. The backlight unit of claim 1, wherein the LED package includes:
   an LED chip light source; and
   a phosphor to surround a top surface and an outer circumference of the LED chip light source, and
   wherein the light diffusion layer is on a top surface of the phosphor.

3. The backlight unit of claim 2, wherein the light diffusion layer is a $TiO_2$ coating layer on the top surface of the phosphor.

4. The backlight unit of claim 1, wherein an inner surface of the wall includes an inclined surface inclined with respect to an optical axis direction of the light emitting unit, and
   wherein each of a boundary between the LED package and the light diffusion layer and a top surface of the light diffusion layer faces the inclined surface.

5. The backlight unit of claim 1, wherein each of a bottom surface of the LED package, a boundary between the LED package and the light diffusion layer, and a top surface of the light diffusion layer is spaced apart from the wall,
   wherein a first distance between the bottom surface of the LED package and the wall is shorter than a second distance between the boundary and the wall, and
   wherein a third distance between the top surface of the light diffusion layer and the wall is longer than the second distance.

6. A display device having a backlight unit, comprising:
a display panel;
an optical sheet configured to face the display panel; and
a backlight unit configured to emit light toward the optical sheet,
wherein the backlight unit includes:
a plurality of light emitting units; and
a reflector having a reflector unit with a space to receive each of the plurality of light emitting units,
wherein each light emitting unit includes:
a light emitting diode (LED) package mounted on a substrate; and
a light diffusion layer on an opposite surface of the substrate in the LED package and having a top surface facing the optical sheet and an outer circumferential surface facing an inner surface of the reflector unit,
wherein a plurality of reflector units are integrally foamed in the reflector,
wherein each of the plurality of reflector units includes a wall defining a space surrounding an outer circumference of each of the light emitting diode (LED) package and the light diffusion layer,
wherein the space expands along a direction leading away from the substrate,
wherein the top surface of the light diffusion layer is a flat surface and has a groove with a cross shape when viewed from above the light diffusion layer,
wherein the light diffusion layer has a coating layer on a top surface of the LED package,
wherein a bottom surface of the light diffusion layer is a substantially same surface as the top surface of the LED package,
wherein the outer circumferential surface of the LED package faces the wall,
and
wherein a distance between the top surface of the light diffusion layer and the optical sheet is uniform.

7. The display device of claim 6, wherein the LED package includes:
an LED chip light source; and
a phosphor to surround a top surface and an outer circumference of the LED chip light source, and
wherein the light diffusion layer is on a top surface of the phosphor.

8. The display device of claim 7, wherein the light diffusion layer is a $TiO_2$ coating layer on the top surface of the phosphor.

* * * * *